(12) United States Patent
    Choi et al.

(10) Patent No.: US 9,183,890 B2
(45) Date of Patent: Nov. 10, 2015

(54) STACKED SEMICONDUCTOR DEVICE AND METHOD OF MANUFACTURING THE SAME

(75) Inventors: Jang Seok Choi, Seoul (KR); Ju-Yun Jung, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 941 days.

(21) Appl. No.: 13/343,072

(22) Filed: Jan. 4, 2012

(65) Prior Publication Data

US 2012/0170345 A1 Jul. 5, 2012

(30) Foreign Application Priority Data

Jan. 4, 2011 (KR) .......................... 10-2011-0000649

(51) Int. Cl.
    *G11C 5/02* (2006.01)
    *H01L 25/065* (2006.01)
    *H01L 25/18* (2006.01)

(52) U.S. Cl.
    CPC .............. *G11C 5/02* (2013.01); *H01L 25/0657* (2013.01); *H01L 25/18* (2013.01); *H01L 2224/0401* (2013.01); *H01L 2224/06181* (2013.01); *H01L 2224/131* (2013.01); *H01L 2224/13025* (2013.01); *H01L 2224/16146* (2013.01); *H01L 2224/16225* (2013.01); *H01L 2224/16227* (2013.01); *H01L 2224/17181* (2013.01); *H01L 2225/06513* (2013.01); *H01L 2225/06517* (2013.01); *H01L 2225/06541* (2013.01); *H01L 2225/06565* (2013.01); *H01L 2924/15311* (2013.01)

(58) Field of Classification Search
    CPC ................. H01L 25/0657; H01L 2225/06513; H01L 2225/06517; H01L 2225/1058; G11C 5/02; G11C 5/04; G11C 2213/71; G11C 5/025; G11C 2207/2245
    USPC ................. 365/51, 63, 52; 257/686, 777–778
    See application file for complete search history.

(56) References Cited

U.S. PATENT DOCUMENTS

| | | | |
|---|---|---|---|
| 7,518,225 B2 * | 4/2009 | Emma et al. .................. | 257/686 |
| 8,008,764 B2 * | 8/2011 | Joseph et al. ................. | 257/686 |
| 8,274,847 B2 * | 9/2012 | Yoko ......................... | 365/189.09 |
| 8,554,984 B2 * | 10/2013 | Yano et al. .................... | 711/103 |
| 2008/0126690 A1 | 5/2008 | Rajan et al. | |

FOREIGN PATENT DOCUMENTS

| KR | 10-2010-0094905 A | 8/2010 |
|---|---|---|
| KR | 10-2010-0097454 A | 9/2010 |

* cited by examiner

*Primary Examiner* — David Lam
(74) *Attorney, Agent, or Firm* — Lee & Morse, P.C.

(57) ABSTRACT

The stacked semiconductor device including a first chip, a second chip positioned on the first chip, the second chip being connected to a plurality of first penetration electrodes and including a first memory and a memory controller that are each controlled by the first chip, and a second memory positioned on the second chip and connected to a plurality of second penetration electrodes and controlled by the memory controller.

12 Claims, 11 Drawing Sheets

FIG. 11

STACKED SEMICONDUCTOR DEVICE AND METHOD OF MANUFACTURING THE SAME

CROSS-REFERENCE TO RELATED APPLICATIONS

This application claims priority under 35 U.S.C. §119(a) from Korean Patent Application No. 10-2011-0000649 filed on Jan. 4, 2011, the disclosure of which is hereby incorporated by reference in its entirety.

BACKGROUND

1. Field

Example embodiments relate to integrated circuits (ICs), and more particularly, to a stacked semiconductor device that connects a central processing unit (CPU) to a memory via an electrical vertical element, and a method of manufacturing the same.

2. Description of the Related Art

Packaging of semiconductor ICs, e.g., memories, has been continuously developed in order to satisfy a demand for miniaturization and improve mounting efficiency. As more compact and high-performance electric/electronic products are in demand, various techniques for stacking memories are being developed.

Stacking of memories denotes a technique of vertically stacking at least two memories. The stacked memories may achieve a product with a memory capacity twice greater than that of a product achieved by a single-layer memory and may increase the efficiency of mounting area being used. Examples of a package in which a plurality of semiconductor chips are stacked include a stack-type semiconductor package in which a plurality of semiconductor chips or semiconductor device packages are stacked.

SUMMARY

One or more embodiments provide a stacked semiconductor device including a relatively larger-sized cache and/or a relatively larger-sized system memory without increasing a chip area of a microprocessor, relative to conventional devices.

One or more embodiments provide a stacked semiconductor device including a first chip, a second chip positioned on the first chip, the second chip being connected to a plurality of first penetration electrodes, and including a first memory and a memory controller that are each controlled by the first chip, and a second memory positioned on the second chip, the second memory being connected to a plurality of second penetration electrodes, and being controlled by the memory controller.

The first chip may include a cache-less microprocessor, the first memory may include an L1 cache, and the second memory may include an L2 cache.

The cache-less microprocessor may include a plurality of cores, and wherein the first memory may include a plurality of L1 core caches respectively connected to the plurality of cores and/or the plurality of first penetration electrodes via the first penetration electrodes.

The first memory may include a cache.

The second memory may include a system memory.

The stacked semiconductor may further include a third memory that is controlled by the memory controller via a plurality of third penetration electrodes.

The third memory may include a flash memory and a solid state drive (SSD) controller configured to control the flash memory, and the memory controller may be configured to control the SSD controller via the plurality of third penetration electrodes.

The stacked semiconductor device may be a smart phone or a solid state drive (SSD).

One or more embodiments provide a method of manufacturing a stacked semiconductor device, the method including forming a first bump on an input/output pad of a first chip, stacking a first penetration electrode of a second chip on the first bump, forming a second bump on an exposed side of the second chip, and stacking a second penetration electrode of a third chip on the second bump.

The first side of the second chip may be opposite the second side of the second chip.

The method may include forming a third bump on the third chip, and stacking a third penetration electrode of a fourth chip, on the third bump.

The first chip may include a cache-less microprocessor.

The second chip may include a cache on one side and a memory controller on a second side thereof.

The cache may include an L1 cache, and the third chip includes an L2 cache.

The one side of the second chip may include a cache, the other side of the second chip includes a memory controller, the third chip includes a system memory, and the fourth chip includes a flash memory and a solid state drive (SSD) controller for controlling the flash memory.

One or more embodiments provide a stacked semiconductor device, including a stacked structure including a first chip, a second chip, a stack memory, and a plurality of penetration electrodes connecting corresponding overlapping portions of the first chip, the second chip and/or the stack memory to each other.

A first group of the plurality of penetration electrodes may extend across the second chip and a second group of the plurality of penetration electrodes may extend across the stack memory.

The plurality of penetration electrodes may connect to corresponding ones of a plurality of conductive microbumps respectively arranged between and electrically connected to corresponding portions of the first chip and/or corresponding ones of the plurality of first and second penetration electrodes.

Conductive wires on a surface of the first chip may be electrically connected to respective ones of the conductive microbumps arranged on corresponding portions of the surface of the first chip.

The second chip may be stacked between the first chip and the stack memory in the stacked structure, the first chip may include a memory controller, and the second chip may include a memory and a stack memory controller, the memory being controlled by the memory controller of the first chip and the stack memory controller may be configured to control the stack memory via a corresponding one of the plurality of penetration electrodes.

BRIEF DESCRIPTION OF THE DRAWINGS

Features will become more apparent to those of ordinary skill in the art by describing in detail exemplary embodiments with reference to the attached drawings, in which.

DETAILED DESCRIPTION

Korean Patent Application No. 10-2011-0000649, filed on Jan. 4, 2011, in the Korean Intellectual Property Office, and entitled: "Stacked Semiconductor Device and Method of Manufacturing the Same," is incorporated by reference herein in its entirety.

Exemplary embodiments now will be described more fully hereinafter with reference to the accompanying drawings. The exemplary embodiments may, however, be embodied in many different forms and should not be construed as limited to the embodiments set forth herein. Rather, these embodiments are provided so that this disclosure will be thorough and complete. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the exemplary embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
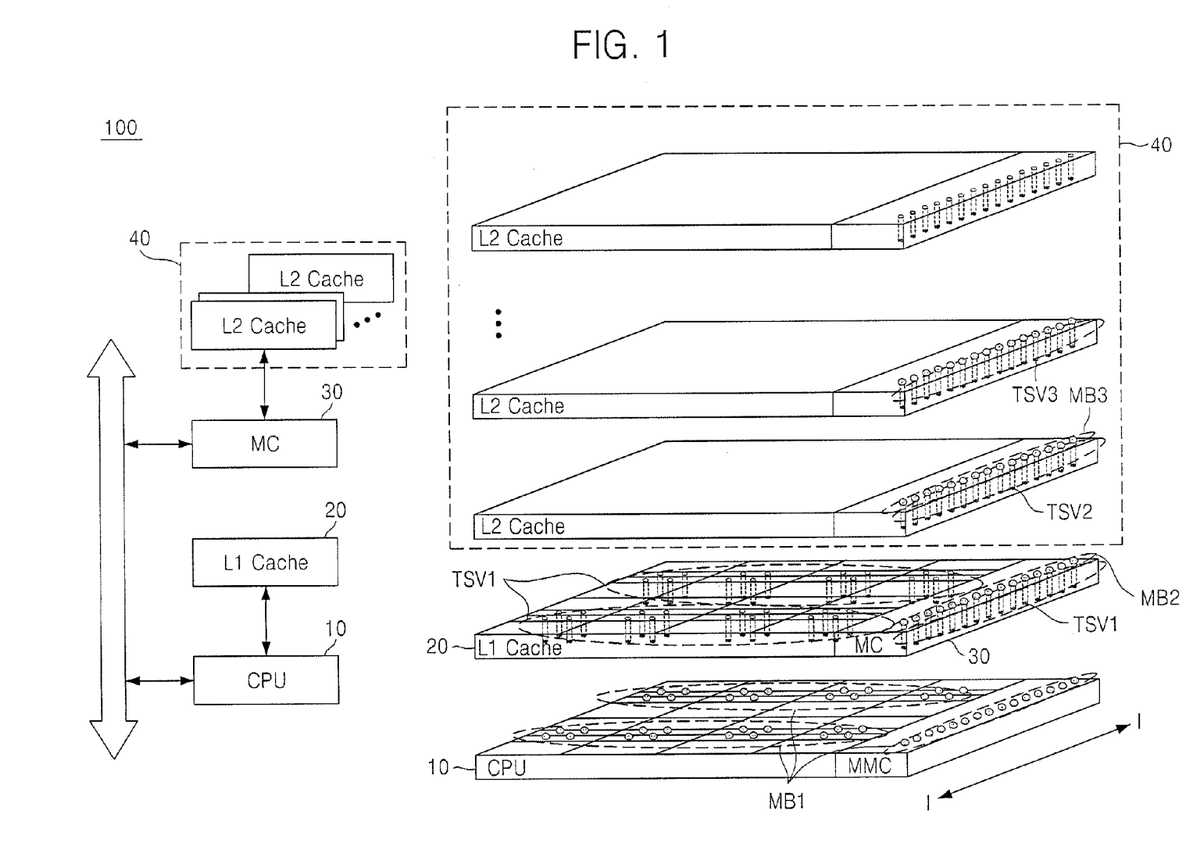
FIG. 1 illustrates a conceptual diagram of an exemplary embodiment of exemplary layers of a stacked semiconductor device.

FIG. 1 illustrates a conceptual diagram of an exemplary embodiment of layers a stacked semiconductor device 100. Referring to FIG. 1, the stacked semiconductor device 100 may include a central processing unit (CPU) 10, an L1 cache 20, a memory controller (MC) 30, and an L2 cache 40.

Each of a plurality of Through Silicon Vias TSVs, TSV1, TSV2, TSV3 may include a plurality of vias that penetrate silicon (e.g., a chip or a die). In one or more embodiments, a TSV may be an example of a penetration electrode or an electrical vertical element. Each of the first through third TSVs TSV1, TSV2, TSV3 may connect a plurality of circuits of a plurality of chips to one another. Corresponding ones of the first through third TSVs TSV1, TSV2, TSV3 may be respectively connected to each other via solder balls or microbumps MB.

The CPU 10 may not include a cache. One or more embodiments employing the CPU 10 may enable a size of a chip to be decreased and/or a number of cores to be increased within a same or smaller size surface area. A plurality of first microbumps MB1 may be formed on an upper surface of the CPU 10 to which the L1 cache 20 may be connected. The L1 cache 20 may be stacked on the upper surface of the CPU 10. The first TSV TSV1 of the L1 cache 20 may be connected to a corresponding one of the first microbumps MB1.

The CPU 10 may directly control the L1 cache 20 via the first TSV TSV1. Connections between the CPU 10 and the L1 cache 20 will be described in detail below with reference to FIG. 3.

The MC 30 may be installed on the same chip where the L1 cache 20 is installed. The MC 30 may control the L2 cache 40. The CPU 10 may further include a main memory controller (MMC) for controlling the MC 30.

The MC 30 may control the L2 cache 40 via a fast serial input/output interface. Examples of the serial input/output interface may include Serial Advanced Technology Attachment (S-ATA), Serial Attached SCSI (SAS), and the like. The SCSI stands for Small Computer System Interface. The MC 30 is connected to the L2 cache 40 via the second TSV TSV2 in a serial input/output below with reference to FIG. 3.

If a system memory or a large-capacity removable memory is further included in addition to the L2 cache 40, the MC 30 may control the L2 cache 40 and the system memory or the large-capacity removable memory. An exemplary stacked semiconductor device further including a system memory or a large-capacity removable memory will be described in detail below with reference to FIG. 5 or 6.

The L2 cache 40 may include one or more chips, e.g., may be implemented with a single chip or a plurality of chips. More particularly, the L2 cache 40 may include several chips in order to increase the memory capacity or memory size of the L2 cache 40. Connection between the CPU 10 and the L1 cache 20 via the first TSV TSV1 will be described in detail below with reference to FIG. 2.

Figure 2:
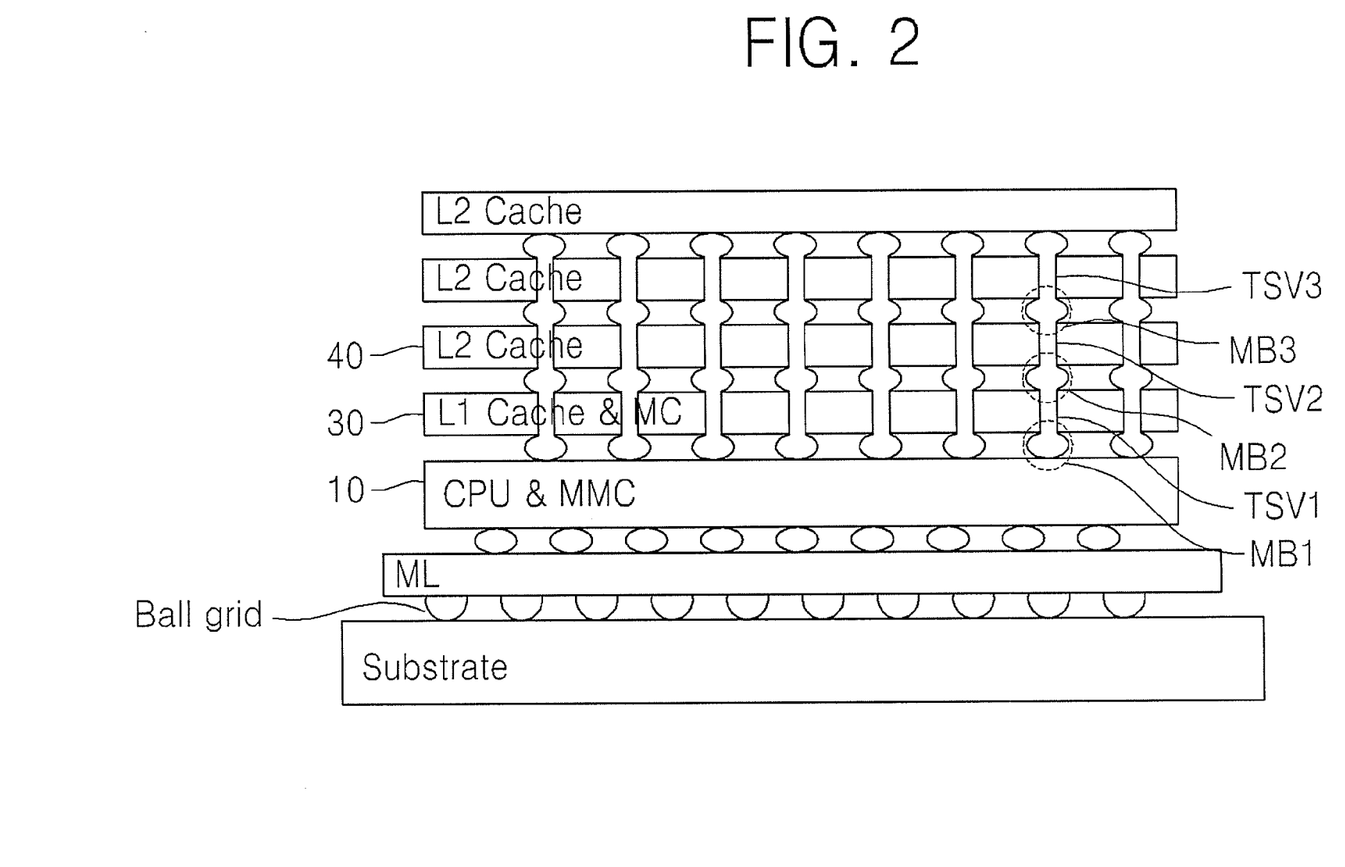
FIG. 2 illustrates a conceptual diagram of a cross-section of the stacked semiconductor device illustrated in FIG. 1.

FIG. 2 illustrates a conceptual diagram of a cross-section of the stacked semiconductor device 100 illustrated in FIG. 1. More particularly, FIG. 1 is a conceptual diagram of exemplary layers employable in a stacked semiconductor device 100, and FIG. 2 illustrates a conceptual cross-sectional diagram of the stacked semiconductor device 100 in a stacked state.

Referring to FIGS. 1 and 2, the CPU 10 may be stacked on an upper surface of a metal layer ML. The metal layer ML and the CPU 10 may be connected together by solder balls or microbumps. Ball grids may be formed on a bottom surface of the metal layer ML. The ball grids may be implemented using solder balls or the like. The CPU 10 may be connected to a substrate via the ball grids.

The MC 30 and the L1 cache 20 may be stacked on the upper surface of the CPU 10. The cross-sectional view of FIG. 2 is relative to line I-I of FIG. 1.

Referring to FIG. 2, the CPU 10 may include the MMC for controlling the MC 30. The first microbump MB1 to be connected to the first TSV TSV1 of the MC 30 may be formed on an upper end of the MMC. The first TSV TSV1 of the MC 30 may be stacked on the first microbump MB1. Referring to FIG. 2, the MMC may be connected to the MC 30.

A second microbump MB2 to be connected to the second TSV TSV2 of the L2 cache 40 may be formed on an upper end of the MC 30. The second TSV TSV2 of the L2 cache 40 may be stacked on the second microbump MB2. Referring to FIG. 2, the MC 30 may be connected to the L2 cache 40.

Figure 3:
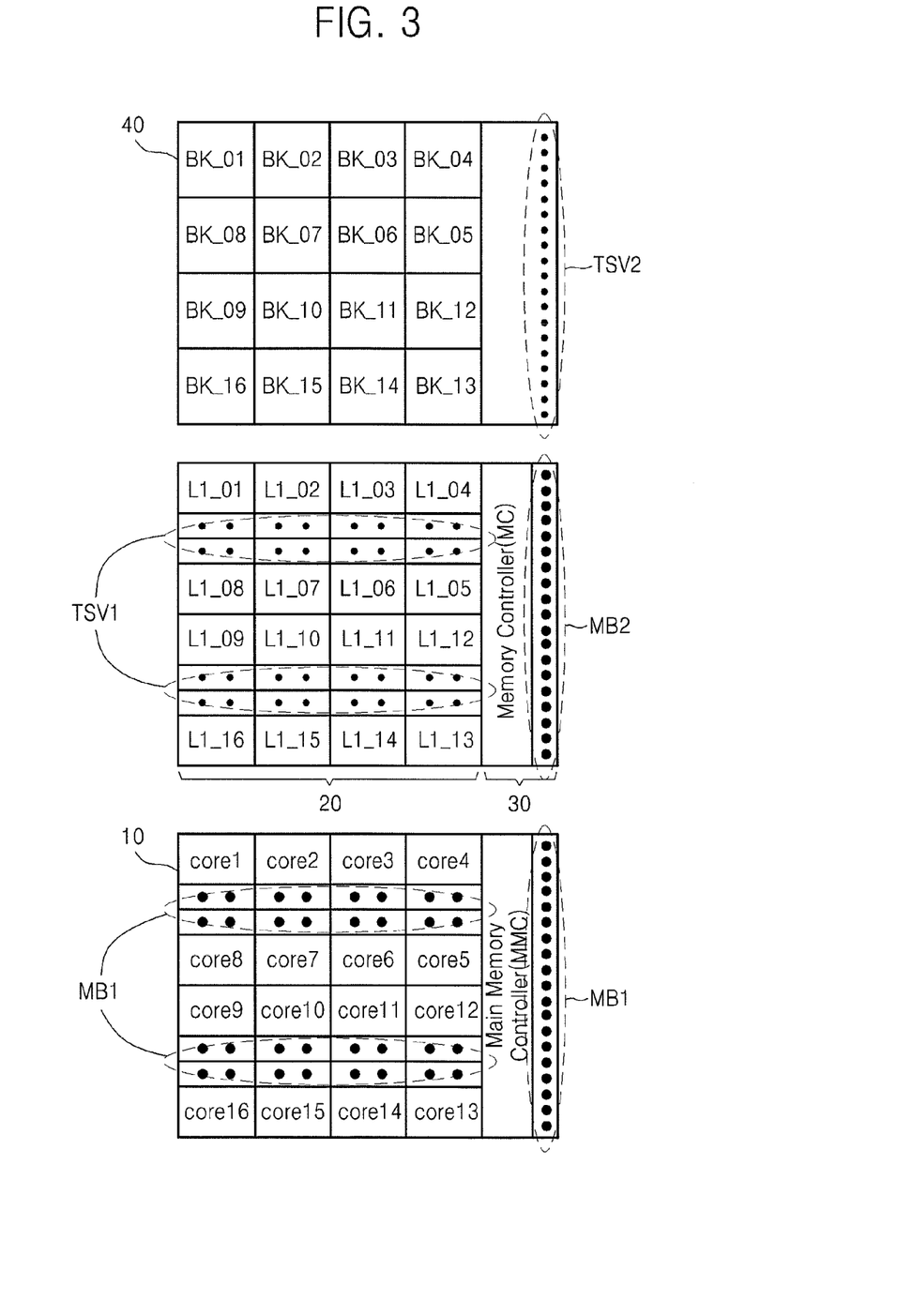
FIG. 3 illustrates a conceptual diagram of an exemplary embodiment of a central processing unit (CPU), a level-1 (L1) cache, and a level-2 (L2) cache of the stacked semiconductor device illustrated in FIG. 1.

FIG. 3 illustrates a conceptual diagram of the CPU 10, the L1 cache 20, and the L2 cache 40 illustrated in FIG. 1, in greater detail.

In one or more embodiments, the CPU 10 may include one or more cores. For example, as shown in FIG. 3, the CPU 10 may include sixteen cores core1 through core16. The CPU 10 may include the MMC for controlling the MC 30. The MMC may be connected to the MC 30 via the connection between the first TSV TSV1 and the first microbump MB1.

The L1 cache 20 may include sixteen L1 core caches L1_01 through L1_16 which are respectively connected to the sixteen cores core1 through core16. The 16 cores core1 through core may be connected to the sixteen L1 core caches L1_01 through L1_16, respectively, via the first TSV TSV1. The sixteen cores core1 through core16 control the sixteen L1 core caches L1_01 through L1_16, respectively, to which the sixteen cores core1 through core16 are connected via the first TSV TSV1.

The L2 cache 40 may include sixteen banks BK_01 through BK_16. The MC 30 may control the 16 banks BK_01 through BK_16 to which the MC 30 is connected via the second TSV TSV2. The sixteen cores core1 through core16 may share the L2 cache 40 including the 16 banks BK_01 through BK_16.

Figure 4:
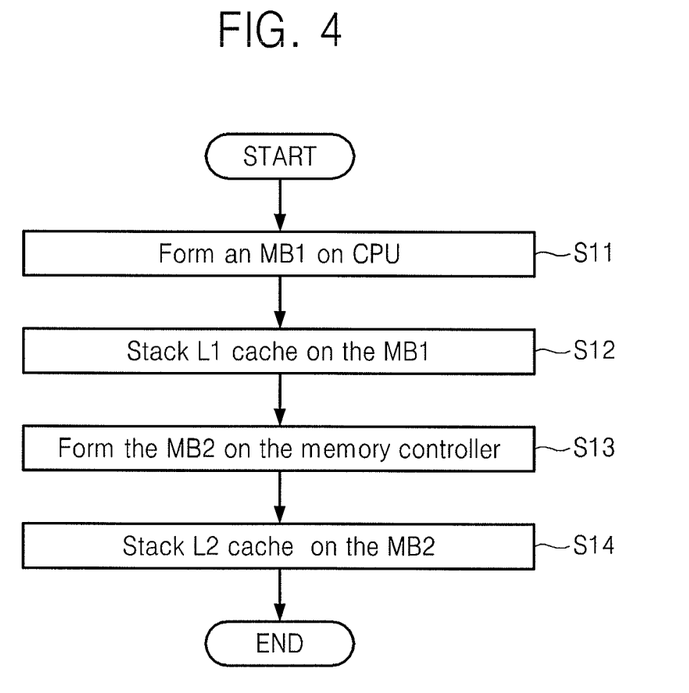
FIG. 4 illustrates a flowchart of an exemplary embodiment of a method of manufacturing the stacked semiconductor device illustrated in FIG. 1.

FIG. 4 illustrates a flowchart of an exemplary embodiment of a method of manufacturing the stacked semiconductor device 100 illustrated in FIG. 1. Referring to FIGS. 1 and 4, the first microbump MB1 may be formed on the CPU 10 and the MMC (S11). The first microbump MB1 may be formed on a location of the CPU 10 and the MMC that faces the first TSV TSV1 of the L1 cache 20 and the MC 30. The first TSV TSV1 of the L1 cache 20 and the MC 30 may then be stacked on the first microbump MB1 (S12).

The second microbump MB2 is formed on the MC 30 (S13). The second microbump MB2 may be formed on a location of the MC 30 that faces the second TSV TSV2 of the L2 cache 40. The L2 cache 40 may then be stacked on the second microbump MB2 (S14). In embodiments in which the L2 cache 40 is includes n layers and/or, e.g., a system memory or a large-capacity removable memory is further included in addition to the L2 cache 40 in order to increase the memory capacity or memory size of the L2 cache 40, respective n microbump MBn, e.g., a third microbump MB3, may be formed on an upper portion of each respective layer of the L2 cache 40.

Figure 5:
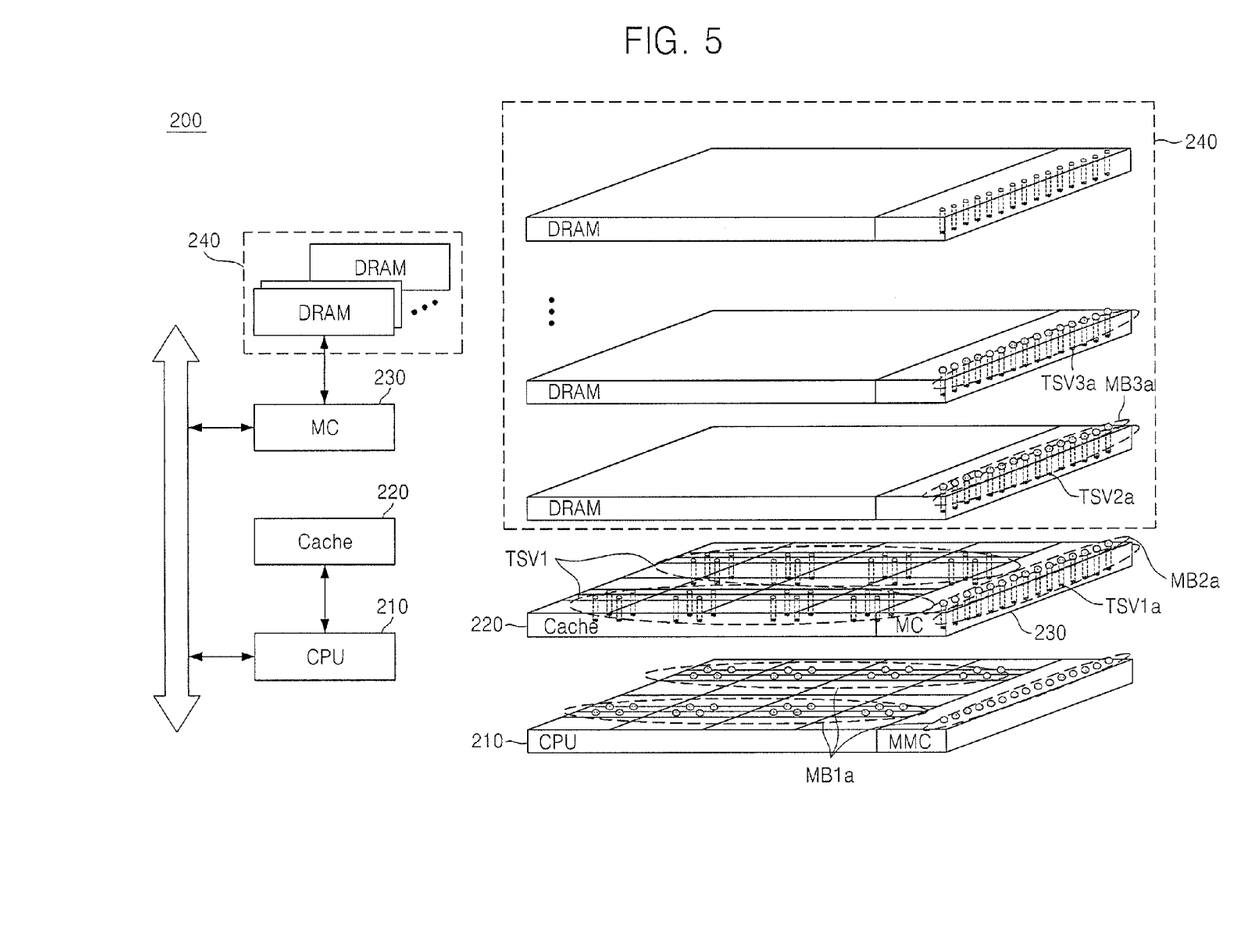
FIG. 5 illustrates a conceptual diagram of a stacked semiconductor device according to another exemplary embodiment.

FIG. 5 illustrates a conceptual diagram of a stacked semiconductor device 200 according to another exemplary embodiment. In general, only differences between the stacked semiconductor device 100 of FIG. 1 and the stacked semiconductor device 200 of FIG. 5 will be described below. The stacked semiconductor device 200 further includes a system memory in addition to a cache. A dynamic random access memory (DRAM) is illustrated as an example of the system memory.

Referring to FIG. 5, the stacked semiconductor device 200 may include a CPU 210, a cache 220, a memory controller (MC) 230, and a DRAM 240.

The CPU 210 may not include a cache. The CPU 210 may enable a size of a chip to be decreased and/or a number of cores to be increased. The cache 220 may include only an L1 cache, include some of L1 or L2 caches, etc. A first microbump MB1a may be formed on an upper surface of the CPU 210 to which the cache 220 is connected. The cache 220 may be stacked on the upper surface of the CPU 210. The cache 220 may include a first TSV TSV1a. The first TSV TSV1a of the cache 220 may be connected to the first microbump MB1a. The CPU 210 may directly control the cache 220 via the first TSV TSV1a.

The MC 230 may be on the same chip where the cache 220 is installed. The MC 230 may control the DRAM 240. The CPU 210 may further include an MMC for controlling the MC 230. The MC 230 may control the DRAM 240 via a fast serial input/output interface. The MC 230 may be connected to the DRAM 240 via a second TSV TSV2a in a serial input/output manner.

The DRAM 240 may be used as a system memory of the CPU 210. In one or more embodiments, the DRAM 240 may be implemented using one or more chips. More particularly, e.g., in the exemplary embodiment of FIG. 5, the DRAM 240 includes a plurality of chips in order to increase the memory capacity or memory size of the DRAM 240. The MC 230 may control the DRAM 240 to which the MC 230 is connected via the second TSV TSV2a. One or more embodiments of the stacked semiconductor device 200 may increase the size of a cache and the size of a system memory without increasing the chip area of the CPU 210.

Figure 6:
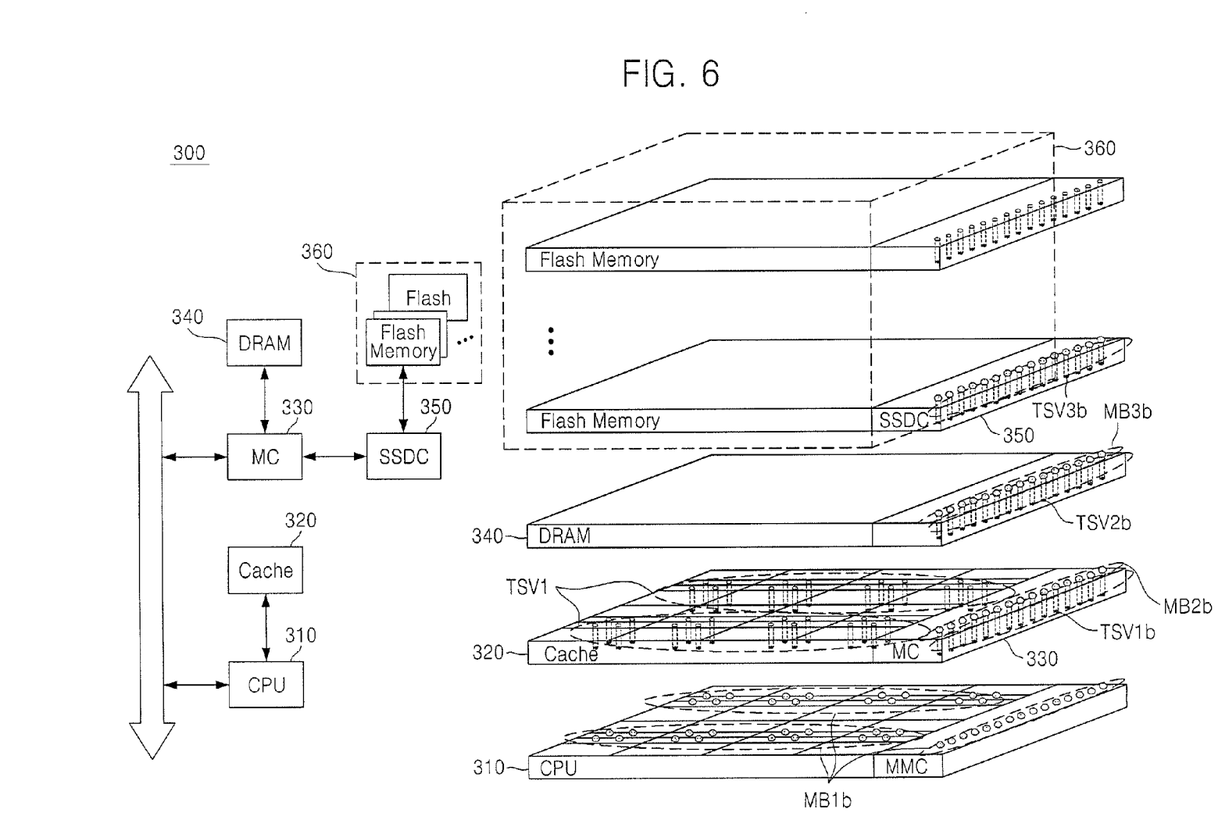
FIG. 6 illustrates a conceptual diagram of another exemplary embodiment of a stacked semiconductor device.

FIG. 6 illustrates a conceptual diagram of the stacked semiconductor device 300 according to another exemplary embodiment. In general, only differences between the stacked semiconductor device 200 of FIG. 5 and the stacked semiconductor device 300 of FIG. 6 will be described below. The stacked semiconductor device 300 may further include a large-capacity memory in addition to a cache and/or a system memory. The DRAM is illustrated as an example of the system memory, and a solid state drive (SSD) is illustrated as an example of the large-capacity memory.

Referring to FIG. 6, the stacked semiconductor device 300 may include a CPU 310, a cache 320, a memory controller (MC) 330, a DRAM 340, an SSD controller (SSDC) 350, and a flash memory 360.

The CPU 310 may not include a cache. The CPU 310 may enable a size of a chip to be decreased and/or a number of cores to be increased. The cache 320 may include only an L1 cache or include only some of L1 or L3 caches. A first microbump MB1b may be formed on an upper portion, e.g., upper surface, of the CPU 310 and the MMC to which the cache 320 is connected. The cache 320 may be stacked on the upper surface of the CPU 310. The cache 320 and the MC 330 may include a first TSV TSV1b. The first TSV TSV1b of the cache 320 and the MMC may be connected to the first microbump MB1b. The CPU 310 may directly control the cache 320 via the first TSV TSV1b.

The MC 330 may be installed on the same chip where the cache 320 is installed. The MC 330 may control the DRAM 340. The CPU 310 may further include an MMC for controlling the MC 330. The MC 330 may control the DRAM 340 via a fast serial input/output interface. The MC 330 may be connected to the DRAM 340 via a second TSV TSV2b in a serial input/output manner.

The DRAM 340 may be used as a system memory of the CPU 310. In one or more embodiments, the DRAM 340 may be implemented using one or more chips. More particularly, e.g., in the exemplary embodiment of FIG. 6, the DRAM 340 includes a plurality of chips in order to increase the memory capacity or memory size of the DRAM 340. The MC 330 may control the DRAM 340 to which the MC 330 is connected via the second TSV TSV2b.

The SSD may include the SSDC 350 and the flash memory 360. The SSD may be a memory device that substitutes for a magnetic disk device, i.e., hard disk drive (HDD), and may be a large-capacity storage device of a computer system or a portable apparatus that uses a flash memory which is a non-volatile memory. The SSD may not be as advantageous as magnetic disk devices in terms of a storage capacity or costs, but may be advantageous as fast accessing, compactness, and stability against impacts.

The SSD controller 350 may control the flash memory, i.e., NAND flash memory 360. Although the flash memory 360 may be implemented by using a single chip, a case where the flash memory 360 is implemented by using several chips in order to increase the memory capacity or memory size of the flash memory 360 is illustrated. The MC 330 may access a large-capacity memory via the control of the SSD controller 350. Accordingly, the stacked semiconductor device 300 may increase sizes of the system memory and cache and/or may further include a large-capacity memory, without increasing a chip area of the CPU 310.

Figure 7:
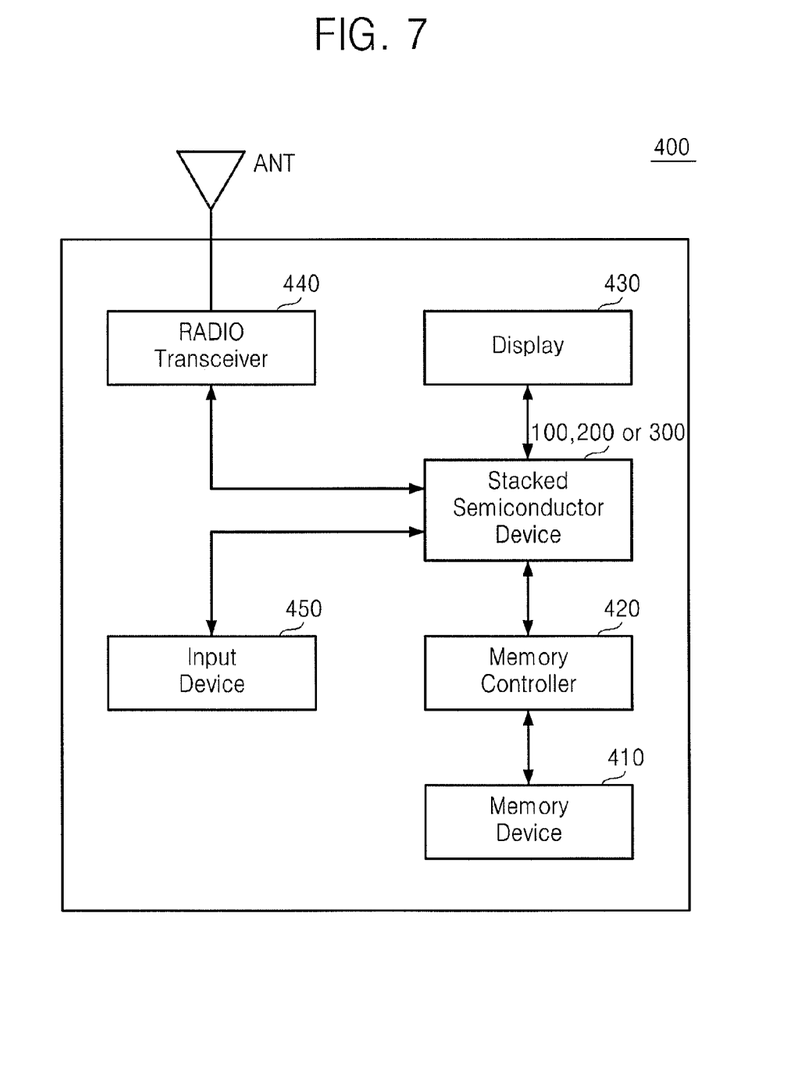
FIG. 7 illustrates a block diagram of an exemplary embodiment of a computer system including the stacked semiconductor device illustrated in FIG. 1, 5 or 6.

FIG. 7 illustrates a block diagram of an exemplary embodiment of a computer system 400 including the stacked semiconductor device 100, 200 or 300 illustrated in FIG. 1, 5 or 6. Referring to FIG. 7, the computer system 400 including the stacked semiconductor device 100, 200 or 300 may be implemented using a cellular phone, a smart phone, tablet personal computer (PC), a personal digital assistant (PDA), a portable multimedia player (PMP), a wireless communication device, etc.

The computer system 400 may include a memory device 410 and a memory controller (MC) 420 capable of controlling an operation of the memory device 410. The MC 420 may control a data access operation of the memory device 410, e.g., a read operation, erase operation, or write operation, under the control of the stacked semiconductor device, e.g., 100.

The data stored in the memory device 410 may be displayed on a display 430 under the control of the stacked semiconductor device 100 (200 or 300) and the MC 420. The radio transceiver 440 may transmit or receive radio signals via an antenna ANT. For example, the radio transceiver 440 may change the radio signals received via the antenna ANT to signals that can be processed by the stacked semiconductor device 100. Accordingly, the stacked semiconductor device 100 (200 or 300) may process the signals output from the radio transceiver 440 and transmit the processed signals to the MC 420 or the display 430. The MC 420 may store the signals processed by the stacked semiconductor device 100 (200 or 300) in the memory device 410.

The radio transceiver 440 may also change the signals output from the stacked semiconductor device 100 to radio signals and output the radio signals to an external device via the antenna ANT. An input device 450 may receive control signals for controlling an operation of the stacked semiconductor device 100 or data which is to be processed by the stacked semiconductor device 100 (200 or 300). The input device 450 may be implemented using a keypad, a keyboard, a pointing device such as a touch pad or a computer mouse, etc.

The stacked semiconductor device 100, 200, 300 may control an operation of the display 430 so that data output from the MC 420, data output from the radio transceiver 440, and/or data output from the input device 450 may be displayed on the display 430. In one or more embodiments, the MC 420 capable of controlling the operation of the memory device 410 may be implemented using a part of the stacked semiconductor device 100. In one or more embodiments, the MC 420 may be implemented by using a chip that is separate from the stacked semiconductor device 100.

Figure 8:
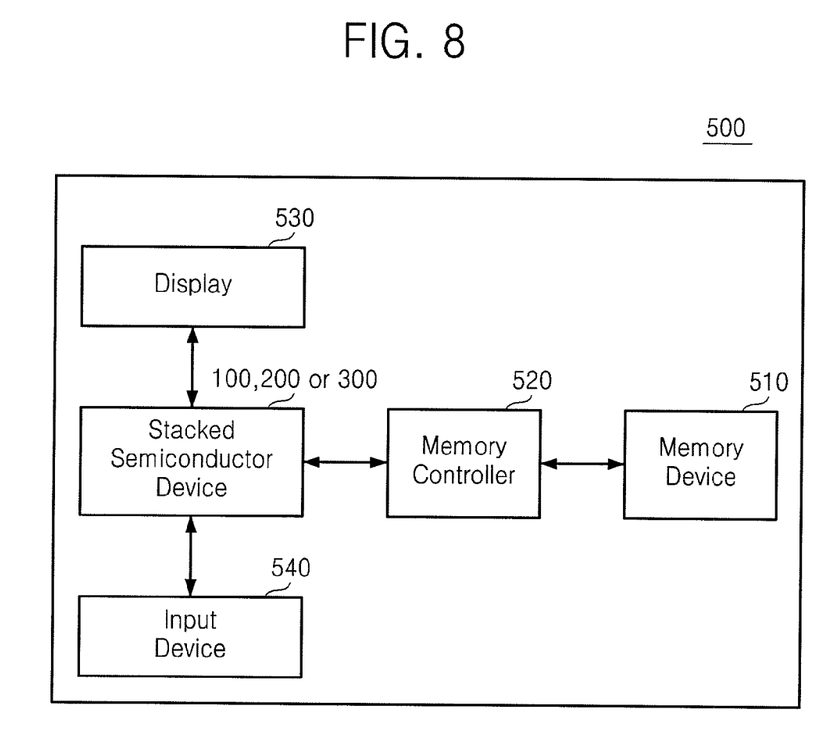
FIG. 8 illustrates a block diagram of another exemplary embodiment of a computer system including the stacked semiconductor device illustrated in FIG. 1, 5 or 6.

FIG. 8 illustrates a block diagram of another exemplary embodiment of a computer system 500 including the stacked semiconductor device 100, 200, 300 illustrated in FIG. 1, 5 or 6. Referring to FIG. 8, the computer system 500 including the stacked semiconductor device 100, 200, 300 may be a personal computer (PC), a network server, a tablet computer, a net-book, an e-reader, a PDA, a portable multimedia player (PMP), an MP3 player, an MP4 player, etc.

The computer system 500 may include the stacked semiconductor device 100, 200, 300, a memory device 510, an MC 520 capable of controlling a data processing operation of the memory device 510, a display 530, and an input device 540.

The stacked semiconductor device 100, 200, 300 may display the data stored in the memory device 510 on the display 530 according to data input from by the input device 540. For example, the input device 540 may be a keypad, a keyboard, or a pointing device such as a touch pad or a computer mouse. The stacked semiconductor device 100 may control an operation, e.g., an entire operation, of the computer system 500 and an operation of the MC 520.

In one or more embodiments, the MC 520 capable of controlling the operation of the memory device 510 may be a part of the stacked semiconductor device 100. In one or more embodiments, the MC 520 may be implemented using a chip that is separate from the stacked semiconductor device 100, 200, 300.

Figure 9:
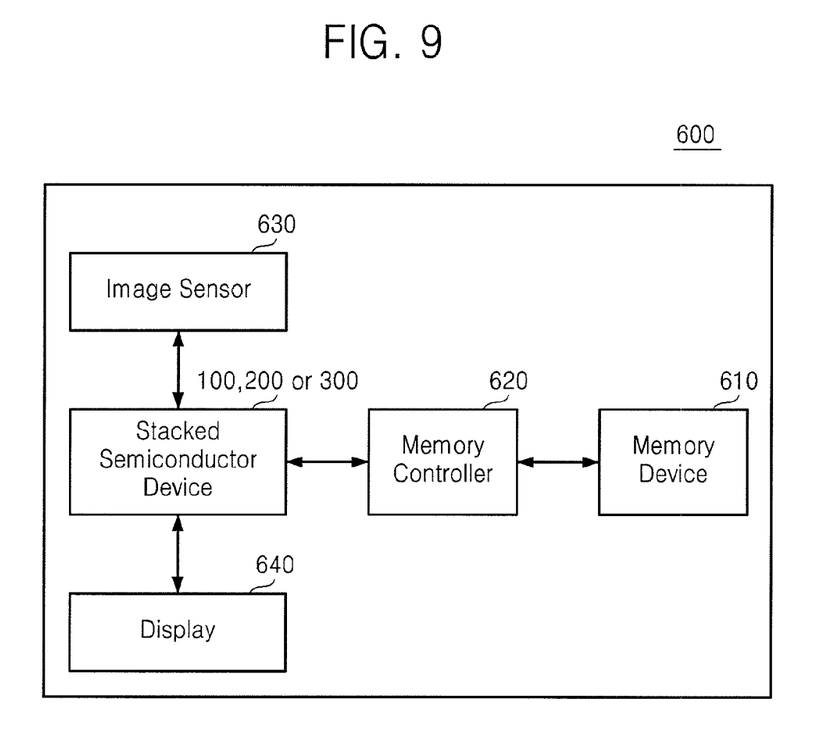
FIG. 9 illustrates a block diagram of another exemplary embodiment of a computer system including the stacked semiconductor device illustrated in FIG. 1, 5 or 6.

FIG. 9 illustrates a block diagram of another exemplary embodiment of a computer system 600 including the stacked semiconductor device 100, 200, 300 illustrated in FIG. 1, 5 or 6. Referring to FIG. 9, the computer system 600 including the stacked semiconductor device 100, 200, 300 may be an image processing device, for example, a digital camera, a cellular phone or a smart phone with the digital camera built therein, etc.

The computer system 600 may include the stacked semiconductor device 100, 200, 300 a memory device 610, and an MC 620 capable of controlling a data processing operation, for example, a write operation or a read operation, of the memory device 610. The computer system 600 may further include an image sensor 630 and a display 640.

The image sensor 630 of the computer system 600 may convert an optical image into digital signals, and the digital signals may be transmitted to the stacked semiconductor device 100 or the MC 620. Under the control of the stacked semiconductor device 100, 200, 300, the digital signals may be displayed on the display 640 or transmitted to the memory device 610 via the MC 620 and stored in the memory device 610. The data stored in the memory device 610 may be displayed on the display 640 under the control of the stacked semiconductor device 100 or the MC 620. In one or more embodiments, the MC 620 capable of controlling an operation of the memory device 610 may be implemented using a part of the stacked semiconductor device 100, 200, 300. In one or more embodiments, the MC 620 may be implemented by using a chip that is separate from the stacked semiconductor device 100, 200, 300.

Figure 10:
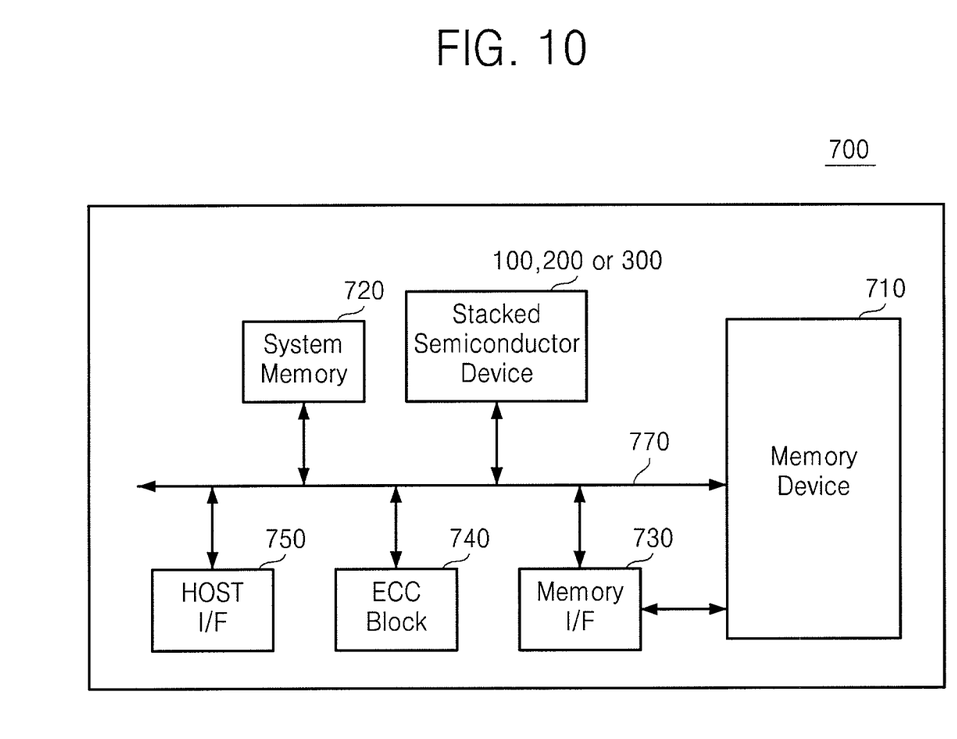
FIG. 10 illustrates a block diagram of another exemplary embodiment of a computer system including the stacked semiconductor device illustrated in FIG. 1, 5 or 6.

FIG. 10 illustrates a block diagram of another exemplary embodiment of a computer system 700 including the stacked semiconductor device 100, 200, 300 illustrated in FIG. 1, 5 or 6. Referring to FIG. 10, the computer system 700 may include a memory device 710 and the stacked semiconductor device 100, 200, 300 capable of controlling an operation of the memory device 710. The memory device 710 may be implemented using a non-volatile memory such as flash memory. The computer system 700 may include a system memory 720, a memory interface (I/F) 730, an error correction code (ECC) block 740, and a host I/F 750.

The computer system 700 may include a system memory 720 capable of being used as an operation memory of the stacked semiconductor device 100. The system memory 720 may be implemented using a non-volatile memory such as read only memory (ROM), a volatile memory such as static random access memory (SRAM), etc.

A host (not shown) connected to the computer system 700 may transmit data to or receive the data from the memory device 710 via the memory I/F 730 and the host I/F 750.

Under the control of the stacked semiconductor device 100, 200, 300, the ECC block 740 may detect and correct an error bit included in the data output from the memory device 710 via the memory I/F 730 and may transmit error-corrected data being a result of the error correction to the host via the host I/F 750. The stacked semiconductor device 100 may control data exchange between the memory I/F 730, the ECC block 740, the host I/F 750, and the system memory device 720 via a bus 770. The computer system 700 may be implemented using a flash memory derive, a Universal Serial Bus (USB) memory drive, an InterChip (IC)-USB memory drive, or a memory stick.

Figure 11:
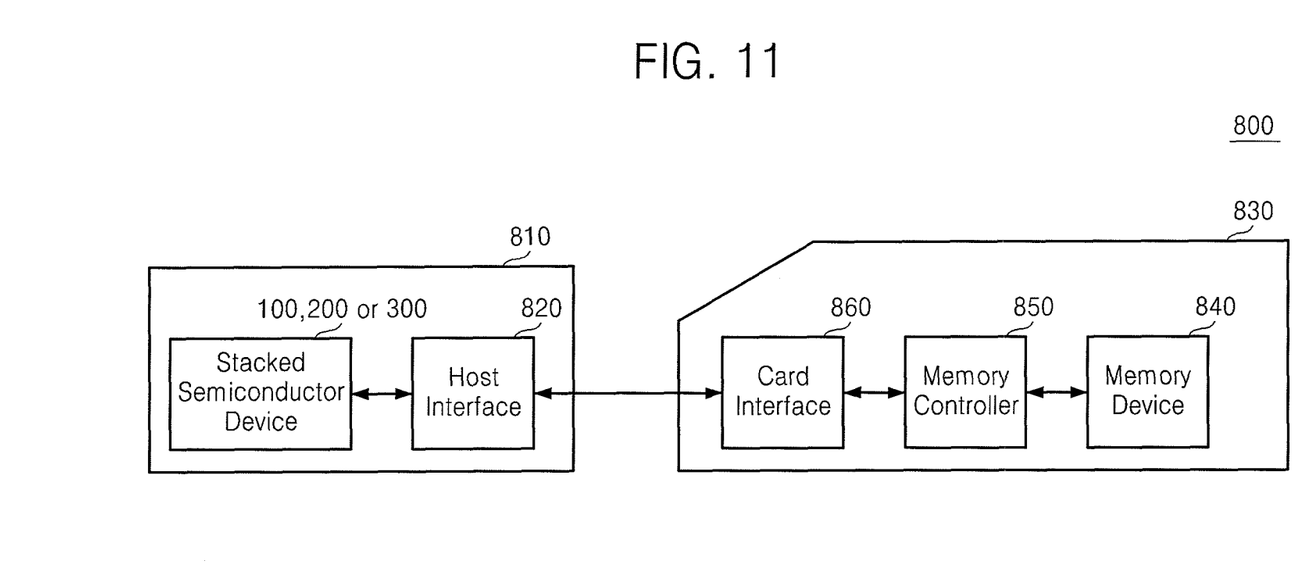
FIG. 11 illustrates a block diagram of another exemplary embodiment of a computer system including the stacked semiconductor device illustrated in FIG. 1, 5 or 6.

FIG. 11 illustrates a block diagram of another exemplary embodiment of a computer system 800 including the stacked semiconductor device 100, 200, 300 illustrated in FIG. 1, 5, or 6. Referring to FIG. 11, the computer system 800 including the stacked semiconductor device 100, 200, 300 may be a host computer, a memory card, or a smart card, etc. The computer system 800 may include a host computer 810 and a memory card 830.

The host computer 810 may include the stacked semiconductor device 100, 200, 300 and a host I/F 820. The memory card 830 may include a memory device 840, an MC 850, and a card I/F 860. The MC 850 may control data exchange between the memory device 840 and the card I/F 860. In one or more embodiments, the card I/F 860 may be a secure digital (SD) card I/F or a multi-media card (MMC) I/F, but embodiments are not limited thereto.

When the memory card 830 is inserted into the host computer 810, the card I/F 860 may interface data exchange between the stacked semiconductor device 100, 200, 300 and the MC 850, according to the protocol of the stacked semiconductor device 100, 200, 300.

In some embodiments, the card I/F 860 may support a USB protocol and an IC-USB protocol. A card I/F used herein may denote hardware capable of supporting the protocols used by the host computer 810, software built in the hardware, or a signal transmission method.

When the computer system 800 is connected to the host I/F 820 of the host computer 810 such as a PC, a tablet PC, a digital camera, a digital audio player, a mobile phone, consol video game hardware, or a digital set-top box, the host I/F 820 may transmit or receive the data stored in the memory device 840 via the card I/F 860 and the MC 850 under the control of the stacked semiconductor device 100, 200, 300.

In general, a performance of a microprocessor depends on the number of cores and the memory capacity or memory size of a cache. In general, if the number of cores is increased or the memory capacity or memory size of the cache is increased in order to improve the performance of the microprocessor, the chip size of the microprocessor increases, leading to an increase in the price of the microprocessor.

In one or more embodiments, a microprocessor may not include a cache in order to increase productivity of the microprocessor. A Level-1 (L1) cache may be stacked on an upper surface of the microprocessor. The L1 cache may be connected to the microprocessor via an electrical vertical element, e.g., Through Silicon Vias (TSVs). A Level-2 (L2) cache may be stacked on an upper surface of the L1 cache. A memory controller (MC) for controlling the L2 cache may be disposed on the chip where the L1 cache is disposed. Accordingly, in one or more embodiments, a stacked semiconductor device may be provided having a larger sized cache without increasing a chip area of a microprocessor.

A stacked semiconductor device according to an embodiment of the present invention may increase the size of a cache or a system memory without increasing the chip area of a microprocessor.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A stacked semiconductor device, comprising:
   a first chip including a cache-less microprocessor;
   a second chip positioned on the first chip, the second chip being connected to a plurality of first penetration electrodes, and the second chip including a first memory and a memory controller that are each to be controlled by the first chip; and
   a first layer including a second memory positioned on the second chip, the second memory being connected to a plurality of second penetration electrodes, and being controlled by the memory controller, wherein data stored in the first memory are accessed by the cache-less microprocessor directly, and data stored in the second memory are accessed by the cache-less microprocessor via the memory controller.

2. The stacked semiconductor device as claimed in claim 1, wherein the first memory includes an L1 cache, and the second memory includes an L2 cache.

3. The stacked semiconductor device as claimed in claim 2, wherein
   the cache-less microprocessor includes a plurality of cores, and wherein the first memory includes a plurality of L1 core caches respectively connected to the plurality of cores and/or the plurality of first penetration electrodes via the first penetration electrodes.

4. The stacked semiconductor device as claimed in claim 1, wherein the first memory includes a cache.

5. The stacked semiconductor device as claimed in claim 1, wherein the second memory includes a system memory.

6. The stacked semiconductor device as claimed in claim 1, further comprising a second layer including a third memory on the first layer including the second memory, the second layer including the third memory to be controlled by the memory controller via a plurality of third penetration electrodes.

7. The stacked semiconductor device as claimed in claim 1, wherein the stacked semiconductor device is a smart phone or a solid state drive (SSD).

8. A stacked semiconductor device comprising:
a first chip;
a second chip positioned on the first chip, the second chip being connected to a plurality of first penetration electrodes, and the second chip including a first memory and a memory controller that are each to be controlled by the first chip;
a second memory positioned on the second chip, the second memory being connected to a plurality of second penetration electrodes, and being controlled by the memory controller;
a third memory to be controlled by the memory controller via a plurality of third penetration electrodes, wherein:
the third memory includes a flash memory and a solid state drive (SSD) controller to control the flash memory, and
the memory controller is to control the SSD controller via the plurality of third penetration electrodes.

9. A stacked semiconductor device, comprising:
a stacked structure including a first chip, a second chip, a stack memory, and a plurality of penetration electrodes connecting corresponding overlapping portions of the first chip, the second chip and/or the stack memory to each other, wherein the second chip is stacked between the first chip and the stack memory in the stacked structure and wherein:
the first chip includes a memory controller,
the second chip includes a memory and a stack memory controller, the memory to be controlled by the memory controller of the first chip and the stack memory controller to control the stack memory via a corresponding one of the plurality of penetration electrodes, wherein the second chip is different from a core chip and wherein the stack memory excludes a memory controller.

10. The stacked semiconductor device as claimed in claim 9, wherein a first group of the plurality of penetration electrodes extend across the second chip and a second group of the plurality of penetration electrodes extend across the stack memory.

11. The stacked semiconductor device as claimed in claim 10, wherein the plurality of penetration electrodes connect to corresponding ones of a plurality of conductive microbumps respectively arranged between and electrically connected to corresponding portions of the first chip and/or corresponding ones of the plurality of first and second penetration electrodes.

12. The stacked semiconductor device as claimed in claim 11, wherein conductive wires on a surface of the first chip are electrically connected to respective ones of the conductive microbumps arranged on corresponding portions of the surface of the first chip.

* * * * *